United States Patent
Hwang

(10) Patent No.: US 8,022,455 B2
(45) Date of Patent: Sep. 20, 2011

(54) METHOD OF FABRICATING SEMICONDUCTOR DEVICE FOR REDUCING PARASITIC CAPACITANCE BETWEEN BIT LINES AND SEMICONDUCTOR DEVICE FABRICATED THEREBY

(75) Inventor: Min-Wook Hwang, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 77 days.

(21) Appl. No.: 12/503,564

(22) Filed: Jul. 15, 2009

(65) Prior Publication Data

US 2010/0181672 A1   Jul. 22, 2010

Related U.S. Application Data

(62) Division of application No. 11/321,527, filed on Dec. 29, 2005, now Pat. No. 7,579,233.

(30) Foreign Application Priority Data

Dec. 31, 2004 (KR) .................. 10-2004-0117868

(51) Int. Cl.
*H01L 27/108* (2006.01)
(52) U.S. Cl. ............ 257/296; 257/522; 257/E21.646; 438/238; 438/619
(58) Field of Classification Search .............. 438/238, 438/239, 619; 257/295, 298, 522
See application file for complete search history.

(56) References Cited

U.S. PATENT DOCUMENTS

| | | | |
|---|---|---|---|
| 6,159,845 A | 12/2000 | Yew et al. | |
| 6,255,224 B1 | 7/2001 | Kim | |
| 6,303,464 B1 | 10/2001 | Gaw et al. | |
| 6,376,330 B1 | 4/2002 | Fulford, Jr. et al. | |
| 6,489,195 B1 | 12/2002 | Hwang et al. | |

(Continued)

FOREIGN PATENT DOCUMENTS

JP    04-123459    4/1992

(Continued)

OTHER PUBLICATIONS

Application and prosecution history of U.S. Appl. No. 11/321,527, filed Dec. 29, 2005, by Min-Wook Hwang, entitled "Method of Fabricating Semiconductor Device for Reducing Parasitic Capacitance Between Bit Lines and Semiconductor Device Fabricated Thereby", which is stored in the United States Patent and Trademark Office (USPTO) Image File wrapper (IFW) system.

*Primary Examiner* — Charles D Garber
*Assistant Examiner* — Reema Patel
(74) *Attorney, Agent, or Firm* — Mills & Onello, LLP

(57) ABSTRACT

In a method of fabricating a semiconductor device capable of reducing parasitic capacitance between bit lines and a semiconductor device fabricated by the method, the semiconductor device includes a semiconductor substrate having buried contact landing pads and direct contact landing pads. A lower interlayer insulating layer is disposed on the semiconductor substrate. A plurality of parallel bit line patterns are disposed on the lower interlayer insulating layer to fill the direct contact holes. A passivation layer that conformally covers the lower interlayer insulating layer and the bit line patterns is formed. An upper interlayer insulating layer for covering the semiconductor substrate having the passivation layer is formed. Buried contact plugs are disposed in the upper interlayer insulating layer between the bit line patterns and extended to contact the respective buried contact landing pads through the passivation layer and the lower interlayer insulating layer. Voids are formed in the upper interlayer insulating layer between the bit line patterns and between the buried contact plugs.

12 Claims, 15 Drawing Sheets

U.S. PATENT DOCUMENTS

| | | |
|---|---|---|
| 6,492,245 B1 | 12/2002 | Liu et al. |
| 2001/0051423 A1 | 12/2001 | Kim et al. |
| 2003/0146513 A1 | 8/2003 | Ireland |
| 2004/0219777 A1 | 11/2004 | Park et al. |

FOREIGN PATENT DOCUMENTS

| | | |
|---|---|---|
| JP | 08-097379 | 4/1996 |
| KR | 2000-0056157 | 9/2000 |
| KR | 10-2004-0002234 | 6/2002 |

METHOD OF FABRICATING SEMICONDUCTOR DEVICE FOR REDUCING PARASITIC CAPACITANCE BETWEEN BIT LINES AND SEMICONDUCTOR DEVICE FABRICATED THEREBY

CROSS-REFERENCE TO RELATED PATENT APPLICATION

This application is a divisional of U.S. application Ser. No. 11/321,527 filed on Dec. 29, 2005, which relies for priority upon Korean Patent Application No. 10-2004-0117868, filed on Dec. 31, 2004, the contents of which are herein incorporated by reference in their entirety.

BACKGROUND OF THE INVENTION

1. Field of the Invention

The present invention relates to a semiconductor device and a method of fabricating the same, and more particularly, to a method of fabricating a semiconductor device capable of reducing parasitic capacitance between bit lines and a semiconductor device fabricated by the method.

2. Description of the Related Art

As semiconductor devices continue to become more highly integrated, horizontal intervals between metal interconnection lines formed on the same level must be reduced. However, if the intervals between the metal interconnection lines are reduced, crosstalk between the metal interconnection lines can occur, and parasitic capacitance between the adjacent metal interconnection lines electrically isolated by an insulating layer can increase. Therefore, problems can occur in that electrical signals of the semiconductor devices are erroneously transmitted and the transmission rate can decrease. The transmission rate of the signals transmitted through the metal connections is inversely proportional to delay constant RC. The dielectric constant of a metal interconnection insulating layer is one of factors affecting the delay constant. The lower the dielectric constant of the metal interconnection insulating layer, the lower the delay constant. Even in a case where the metal interconnection insulating layer is made of a low dielectric (low-k) material, the dielectric constant is still in a range of 2.5 to 3.5. In order to increase the signal transmission rate by decreasing the delay constant, the metal interconnection lines must be insulated by using a lower dielectric constant material. Therefore, among approaches for reducing the parasitic capacitance between the metal interconnection lines, there is proposed a method of forming voids made of air having a dielectric constant of about 1 in the metal interconnection insulating layer.

A method of forming voids between metal interconnection lines is disclosed in U.S. Pat. No. 6,303,464, entitled "Method and structure for reducing interconnection system capacitance through enclosed void in a dielectric layer" by Gaw, et al. In addition, another method is disclosed in U.S. Pat. No. 6,376,330, entitled "Dielectric having an air gap formed between closely spaced interconnect lines" by Fulford, Jr. et al.

Recently, as semiconductor devices such as DRAMs become more highly integrated, there is a need to implement a process for minimizing semiconductor chip sizes. According to the high integration of the semiconductor devices, the bit lines, which are one of components of the DRAM, are formed by using a fine processing technique. By shortening the intervals between the bit lines and reducing the sizes of the bit lines, the semiconductor devices can be scaled down. As the intervals between the bit lines are shortened, parasitic capacitance also occurs between the bit lines in a manner similar to the aforementioned metal interconnection lines.

In addition, since a plurality of bit lines are formed in a narrow space, the widths of the bit lines decrease, and the resistance increases due to a narrow cross-sectional area. The resistance and parasitic capacitance in the bit lines cause increase in a total resistance which blocks the flow of the electrical signals transmitted by circuits and causes signal transmission delay according to phase change. Since the signal transmission delay deteriorates the efficiency and performance of the semiconductor devices, the signal transmission delay must be prevented. Therefore, there is a need for a method of reducing the parasitic capacitance and resistance due to the bit lines. Among the methods of reducing the parasitic capacitance of the bit lines, there is proposed a method of decreasing the widths of the bit lines and increasing the intervals between the bit lines. However, since the sizes of the bit lines are closely related to the resistance, there is a limitation on the decrease in the size of the bit lines, and the increase in the sizes of the bit lines may be traded off with the tendency of reduction in the design rule. Therefore, there are proposed approaches for reducing the parasitic capacitance between the bit lines. The methods of reducing the parasitic capacitance between the metal interconnection lines disclosed in the aforementioned U.S. Pat. Nos. 6,303,464 and 6,376,330 have difficulty in being applied to general production methods for semiconductor devices such as DRAMs having a generally known capacitor-over-bit-line (COB) structure. A method of reducing the parasitic capacitance between the bit lines in a COB-structured DRAM device is disclosed in Korean Patent Publication No. 2004-0002234, titled "Method of forming bit lines in a semiconductor device" by Woo.

FIGS. 1A to 2B are cross-sectional views showing a method of fabricating a semiconductor device disclosed in Korean Patent Publication No. 2004-0002234. In FIGS. 1A to 2B, FIGS. 1A and 2A are cross-sectional view taken along a direction perpendicular to the bit lines, and FIGS. 1B and 2B are cross-sectional views taken along a direction parallel to the bit lines to cut a space between the bit lines.

Referring to FIGS. 1A and 1B, a lower interlayer insulating layer 21 having bit line contact holes are formed on a semiconductor substrate 1. The lower interlayer insulating layer 21 may be constructed with a silicon oxide layer. Next, a plurality of parallel bit line patterns 29 are formed to fill the bit line contact holes. In this case, the bit line patterns 29 may be formed by sequentially stacking the bit lines 25 and hard mask layer patterns 27. An upper interlayer insulating layer 33 having poor step coverage is formed on the semiconductor substrate 1 having the bit line patterns 29. As a result, voids 35 are formed between the bit line patterns 29. Since the voids are made of air, the voids have a very low dielectric constant of about 1.

Referring to FIGS. 2A and 2B, buried contact holes 37 are formed to pass through the upper interlayer insulating layer 33 and the lower interlayer insulating layer 21. In this case, the buried contact holes 37 and the voids 35 are opened to each other, so that air can pass between them. In this manner, if buried contact plugs are formed within the buried contact holes 37 opened to the voids 35 in a general subsequent process, the buried contact plugs can be formed within the voids. As a result, electrical short between the buried contact plugs can occur. Therefore, in order to prevent the buried contact holes 37 and the voids 35 from being opened to each other, general insulating spacers for covering side walls of the buried contact holes 37 may be formed.

However, as the semiconductor devices continue to become scaled down in size, the aspect ratios of the buried contact holes tend to increase. Therefore, in order to form the insulating spacers, in a case where conformal spacer insulating layers are formed on the entire surface of the semiconductor substrate having the buried contact holes 37, the spacer insulating layer is formed on inner walls of the voids 35, so that the voids 35 may become buried with the spacer insulating layer. Otherwise, the spacer insulating layer is formed with a predetermined thickness on the buried contact holes 37 and the inner walls of the voids 35, so that the buried contact holes 37 and the voids 35 may still be opened to each other.

In order to form the insulating spacers in a case where spacer insulating layers having poor step coverage on the entire surface of the semiconductor substrate having the buried contact holes 37, since the aspect ratio of the buried contact holes 37 is large, the spacer insulating layer is more rapidly formed on edge portions of upper regions of the buried contact holes 37. Therefore, the upper open region of the buried contact holes 37 may be covered with the spacer insulating layer, and the lower regions of the buried contact holes 37 may remain as empty spaces. As a result, it may be difficult to form the insulating spacers on the side walls of the buried contact holes 37 opened to the voids 35.

Accordingly, in the fabrication of the semiconductor devices such as COB-structured memory devices, using the general fabrication methods described above, it may substantially difficult to form the voids between the bit lines. Therefore, there is a need for new structures and methods for forming the voids between the bit lines.

SUMMARY OF THE INVENTION

The present invention provides to a method of fabricating a semiconductor device by forming voids made of air having a low dielectric constant between bit liens, thereby reducing parasitic capacitance between bit lines.

The present invention also provides a semiconductor device by disposed voids made of air having a low dielectric constant between bit lines, thereby reducing parasitic capacitance between bit lines.

According to an aspect of the present invention, there is provided a method of fabricating a semiconductor device capable of reducing parasitic capacitance between bit lines. The method comprises a step of preparing a semiconductor substrate having buried contact landing pads and direct contact landing pads. A lower interlayer insulating layer having direct contact holes that expose the direct contact landing pads is formed on the semiconductor substrate. Parallel bit line patterns that fill the direct contact holes are formed on the lower interlayer insulating layer A conformal passivation layer is formed on the semiconductor substrate having the bit line patterns. A sacrificial insulating layer that fills a space between the bit line patterns is formed on the semiconductor substrate having the passivation layer. The sacrificial insulating layer, the passivation layer, and the lower interlayer insulating layer are sequentially patterned to form buried contact holes that expose the buried contact landing pads. Insulating spacers that cover side walls of the buried contact holes are formed. Buried contact plugs that fill the buried contact holes are formed. The sacrificial insulating layer is selectively removed. An upper interlayer insulating layer having poor step coverage is formed on the resulting structure from which the sacrificial insulating layer is removed, so that voids are formed between the bit line patterns.

In an embodiment of the present invention, the bit line patterns are formed with a stacked layer of bit lines and hard mask layer patterns. In this case, the bit lines may be formed with a polysilicon layer, a tungsten layer, or a stacked layer of a titanium nitride layer and a tungsten layer. The hard mask layer patterns may be a silicon nitride layer.

In another embodiment, the sacrificial insulating layer may be formed with an insulating layer having an etching selection ratio with respect to the passivation layer. In this case, the passivation layer may be formed with a silicon nitride layer. The sacrificial insulating layer may be formed with a silicon oxide layer.

In still another embodiment, forming the sacrificial insulating layer comprises: forming a first sacrificial insulating layer that fills a space between the bit line patterns and exposing the passivation layer on the bit line patterns; and forming a second sacrificial insulating layer on the passivation layer exposed by the first sacrificial insulating layer and the first sacrificial insulating layer. In this case, forming the first sacrificial insulating layer comprises: forming an insulating material layer to fill a space between the bit line patterns on the passivation layer; and planarizing the insulating material layer to expose the passivation layer on the bit line patterns.

In another embodiment, the method may further comprise, after forming the buried contact holes, expanding dimensions of the buried contact holes by isotropic-etching the sacrificial insulating layer and the lower interlayer insulating layer. In this case, the isotropic-etching may be performed by using an etchant containing hydrofluoric acid. In addition, the passivation layer may have etch resistance to the isotropic etching.

In another embodiment, the insulating spacers may be formed with a silicon nitride layer.

In another embodiment, the buried contact plugs may be formed with a polysilicon layer.

In another embodiment, removing the sacrificial insulating layer may be performed by using a wet etching process.

In another embodiment, the upper interlayer insulating layer may be formed with a silicon nitride layer or a silicon oxide nitride layer.

In another embodiment, lower regions of the voids may be formed to be wider than upper regions thereof.

According to another aspect of the present invention, there is provided a semiconductor device capable of reducing parasitic capacitance between bit lines. The semiconductor device comprises a semiconductor substrate having buried contact landing pads and direct contact landing pads. A lower interlayer insulating layer is disposed on the semiconductor substrate. A plurality of parallel bit line patterns are disposed on the lower interlayer insulating layer to fill the direct contact holes. A passivation layer conformally covering the lower interlayer insulating layer and the bit line patterns is provided. An upper interlayer insulating layer for covering the semiconductor substrate having the passivation layer is disposed. Buried contact plugs are disposed in the upper interlayer insulating layer between the bit line patterns and extended to contact the respective buried contact landing pads through the passivation layer and the lower interlayer insulating layer. Voids are formed in the upper interlayer insulating layer between the bit line patterns and between the buried contact plugs.

In one embodiment, the bit line patterns comprise bit lines and hard mask layer patterns which are sequentially stacked. In this case, the bit lines may be a polysilicon layer, a tungsten layer, or a stacked layer of a titanium nitride layer and a tungsten layer. The hard mask layer patterns may be a silicon nitride layer.

In another embodiment, the passivation layer may comprise a silicon nitride layer.

In another embodiment, the upper interlayer insulating layer may comprise a silicon nitride layer or a silicon oxide nitride layer.

In another embodiment, the buried contact plugs may comprise a polysilicon layer.

In yet further still another embodiment, the semiconductor device may further comprise insulating spacers for surrounding side walls of the buried contact plugs. In this case, the insulating spacers may comprise a silicon nitride layer.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1A:
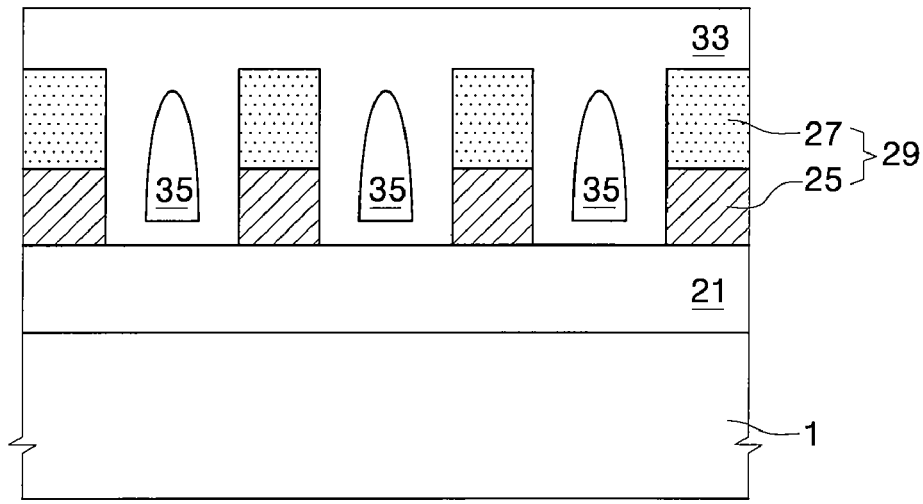
FIGS. 1A to 2B are cross-sectional views of a conventional method of fabricating a semiconductor device.
Figure 1B:
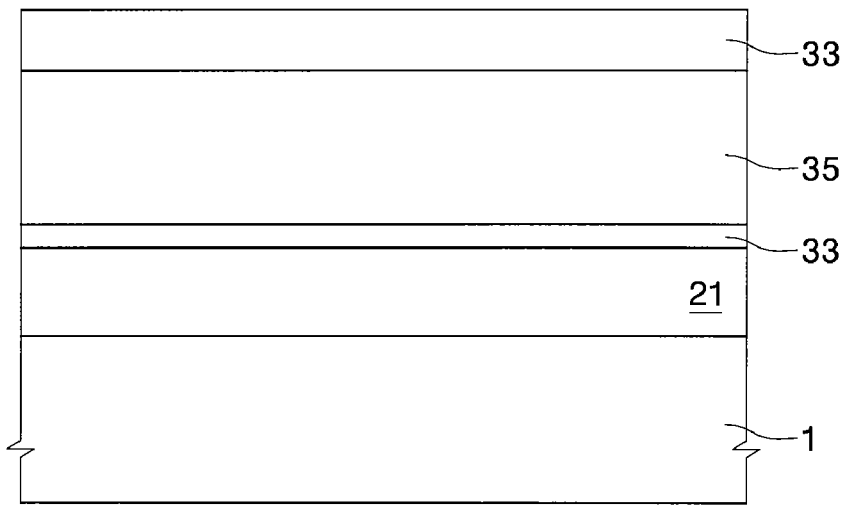
Figure 2A:
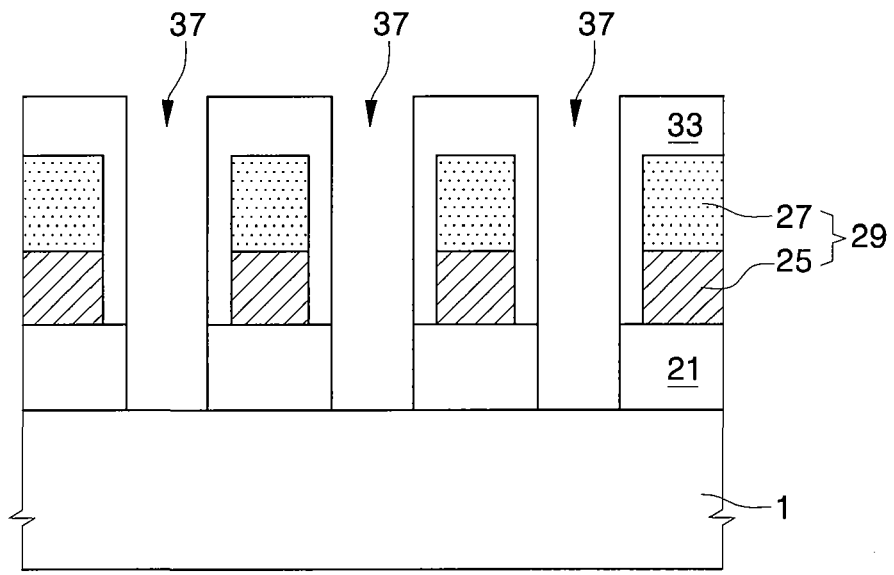
Figure 2B:
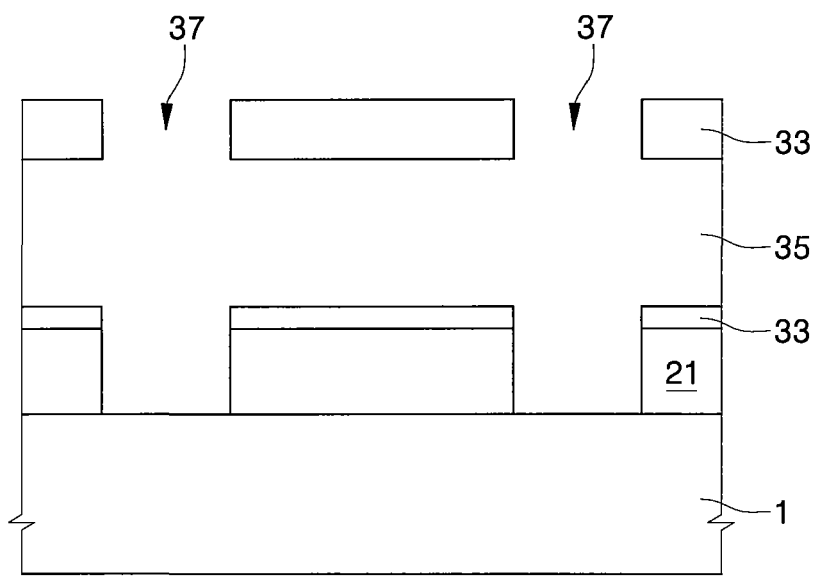

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete. In the drawings, the thicknesses and lengths of layers and regions are exaggerated for clarity. Like reference numerals in the drawings denote like elements, and thus their description will be omitted.

Figure 3:
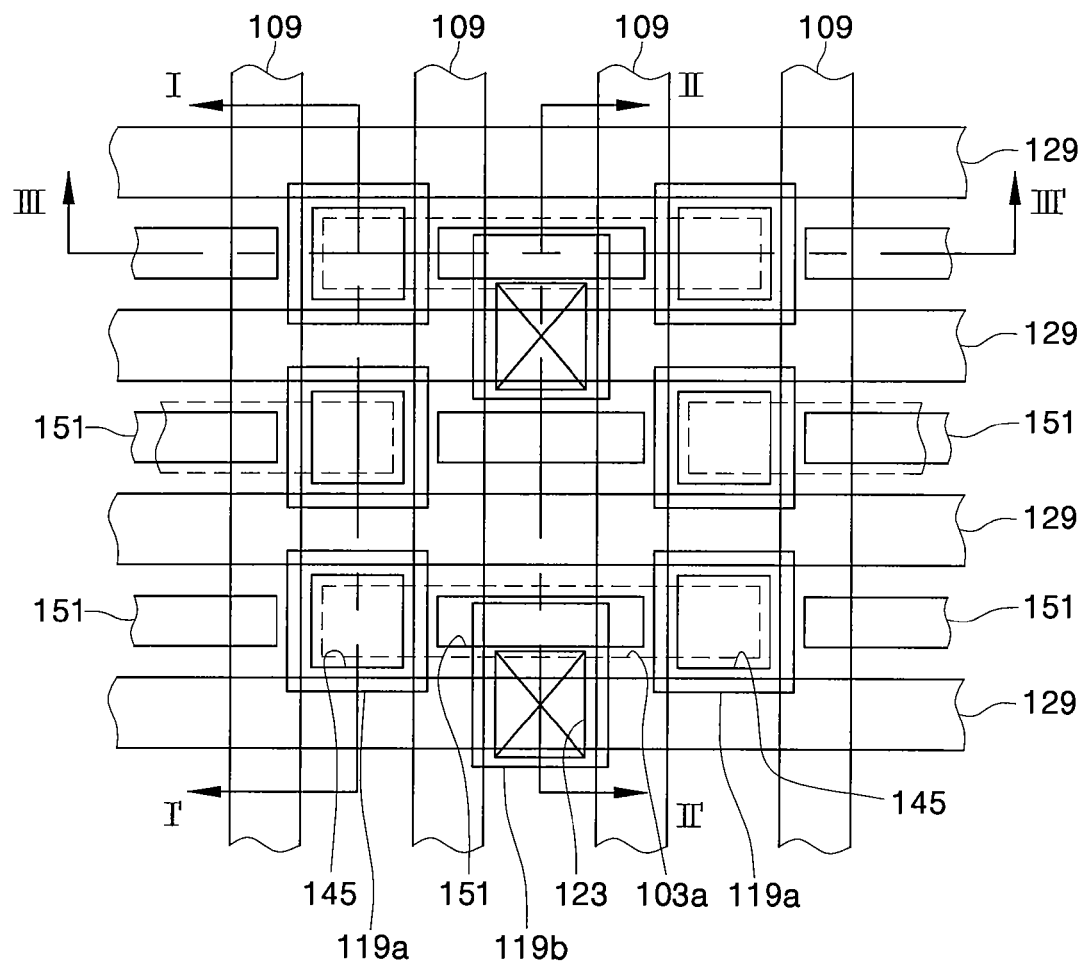
FIG. 3 is a plan view of a semiconductor device according to an embodiment of the present invention.
Figure 4A:
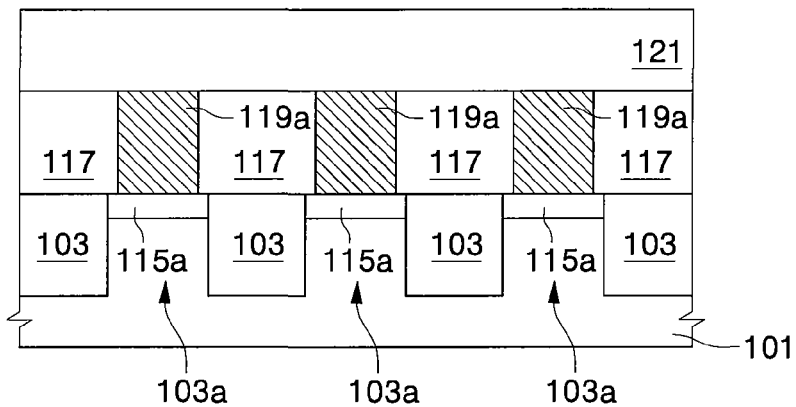
FIGS. 4A to 9C are cross-sectional views of a method of fabricating a semiconductor device according to an embodiment of the present invention.
Figure 4B:
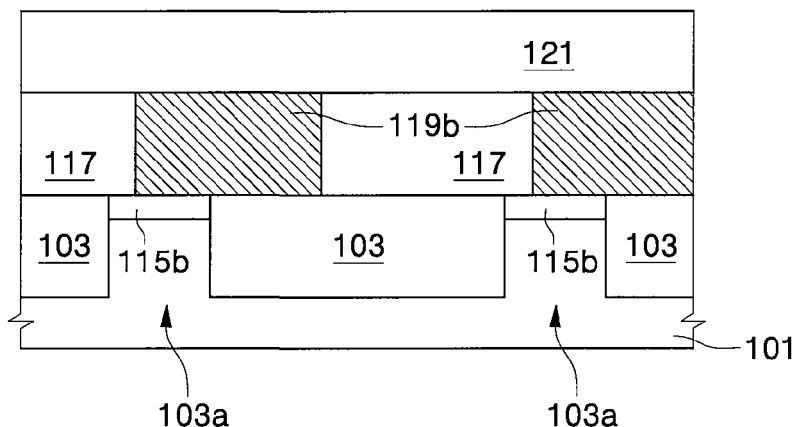
Figure 4C:
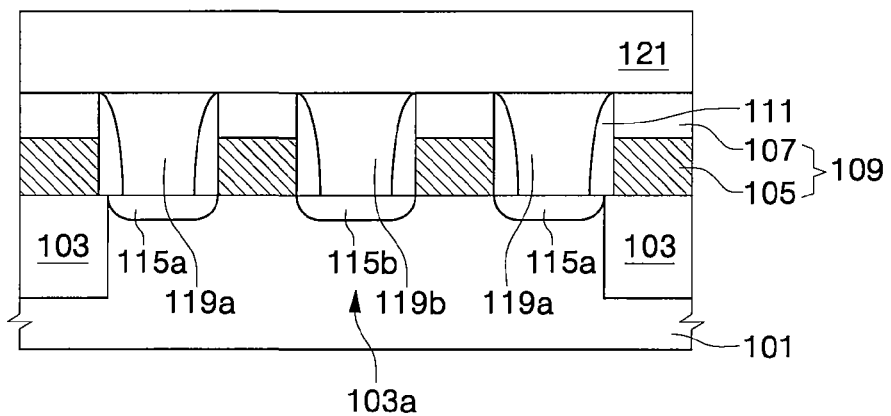
Figure 5A:
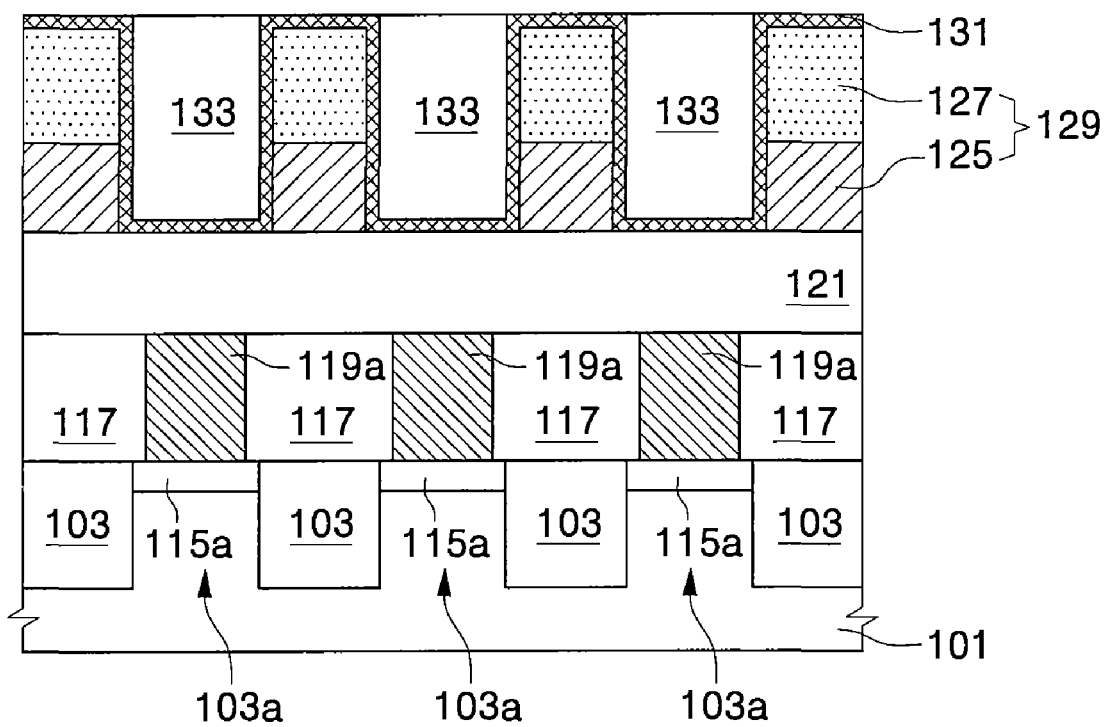
Figure 5B:
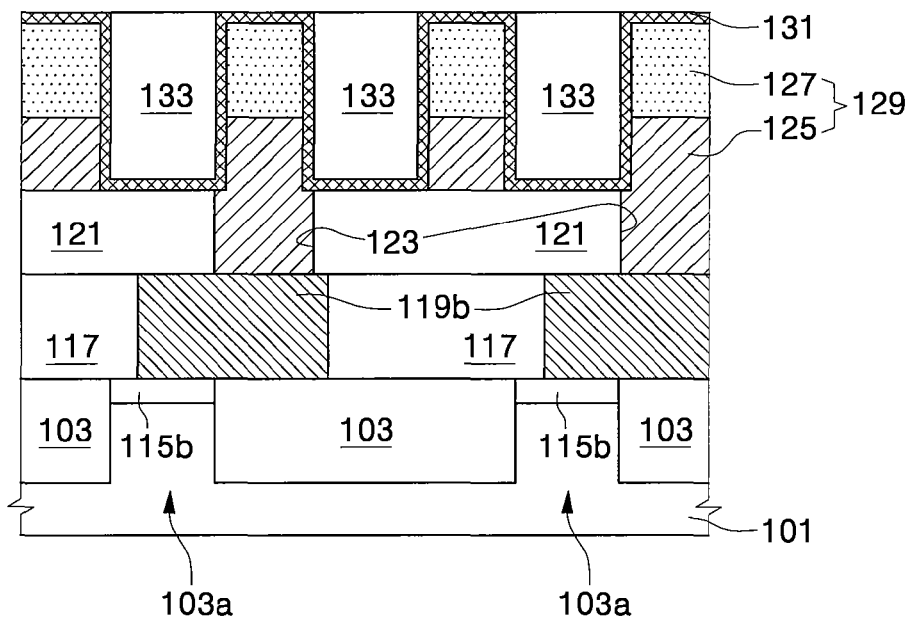
Figure 5C:
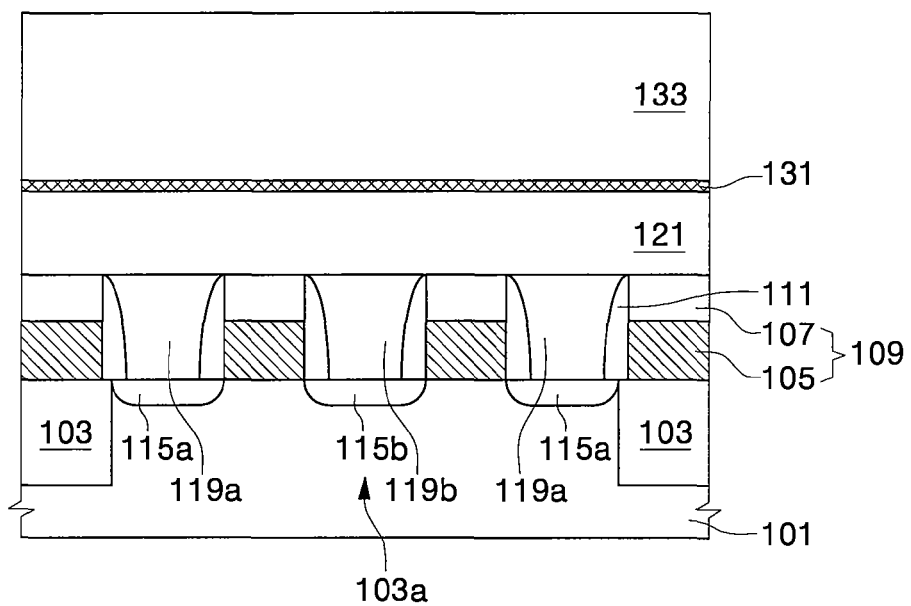
Figure 6A:
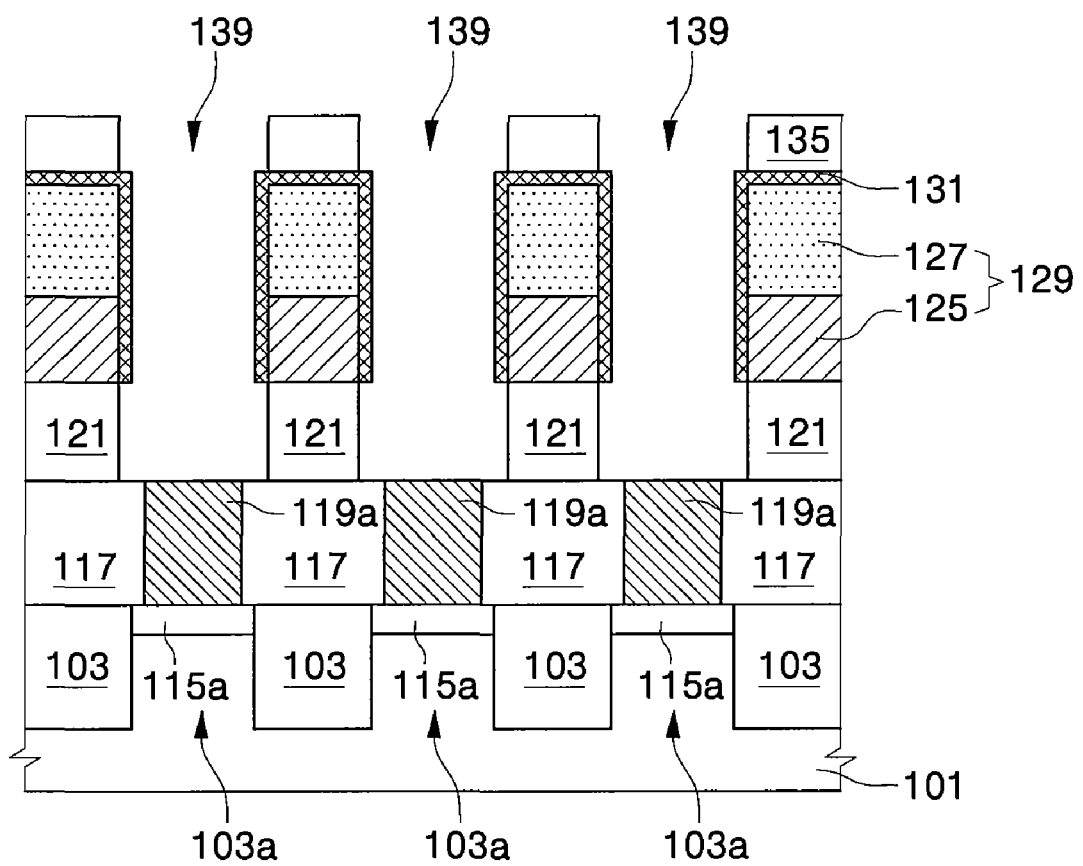
Figure 6B:
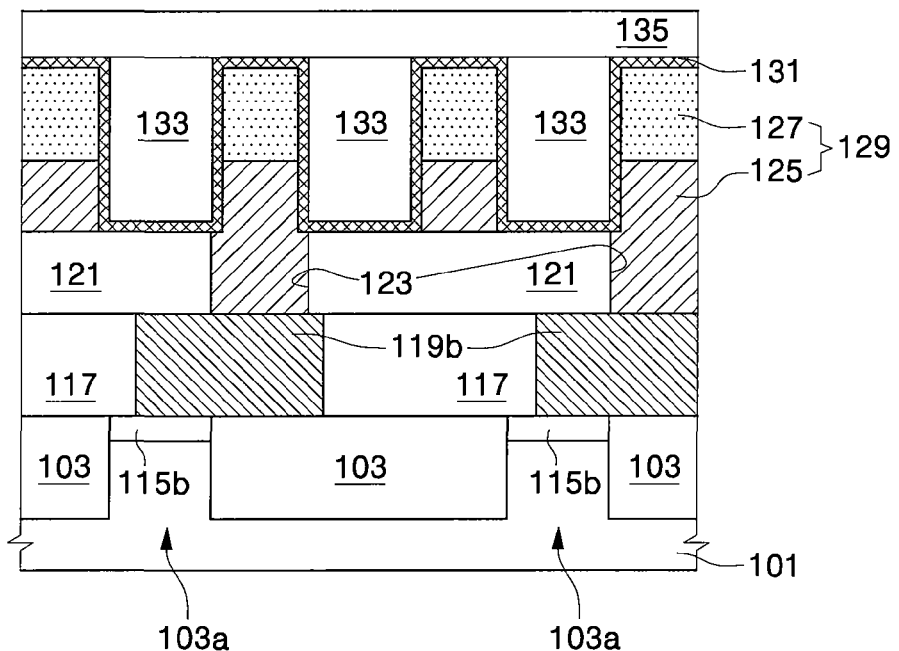
Figure 6C:
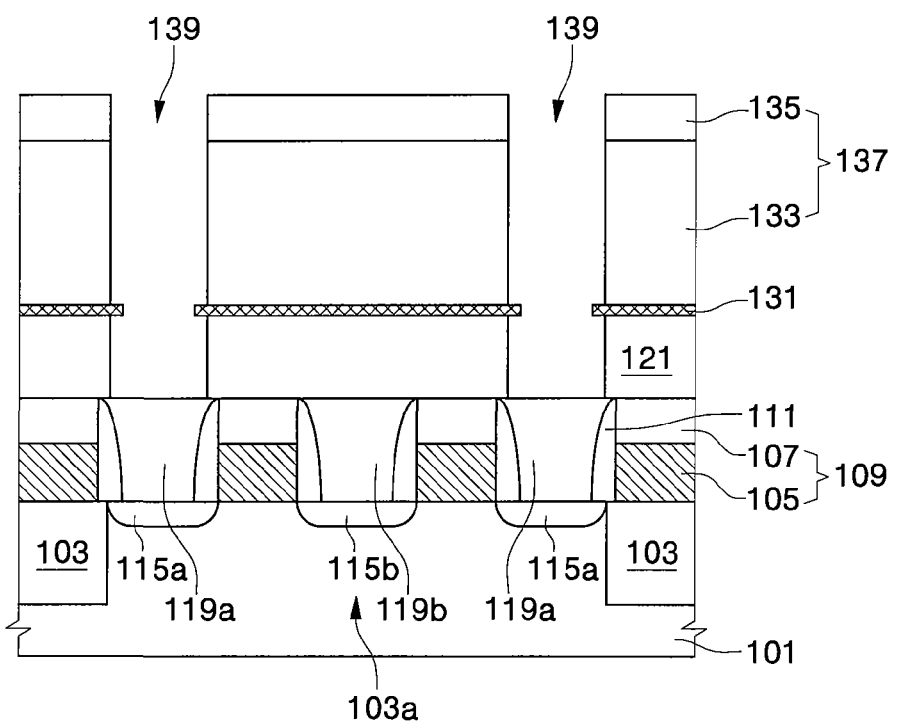
Figure 7A:
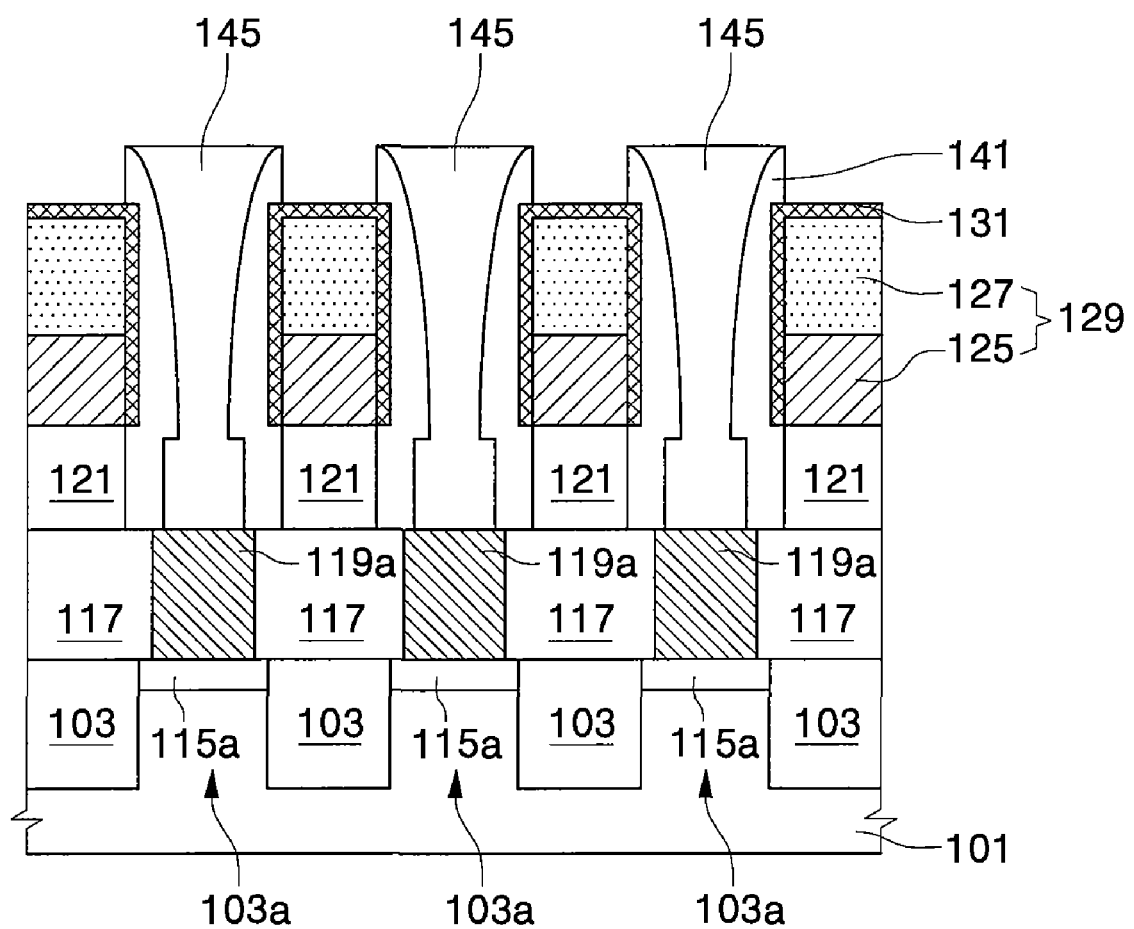
Figure 7B:
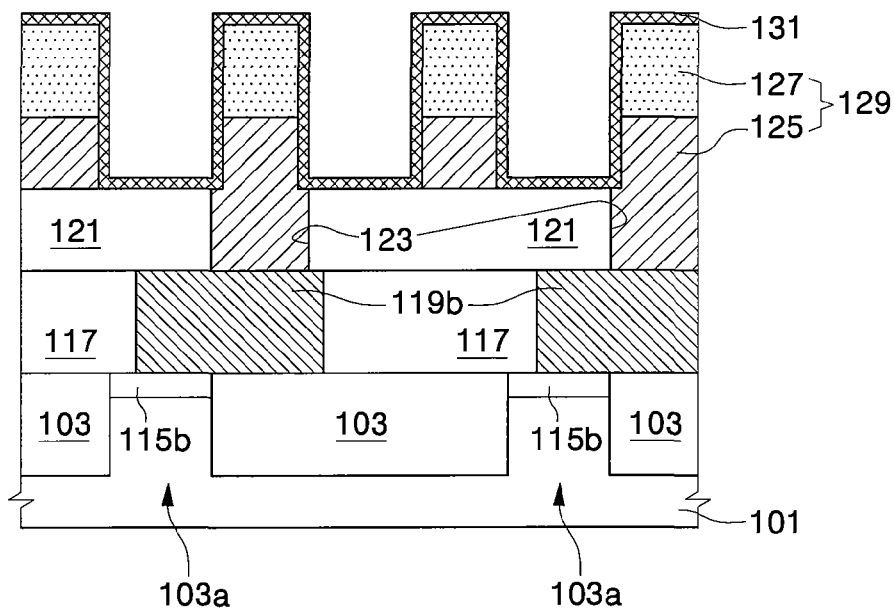
Figure 7C:
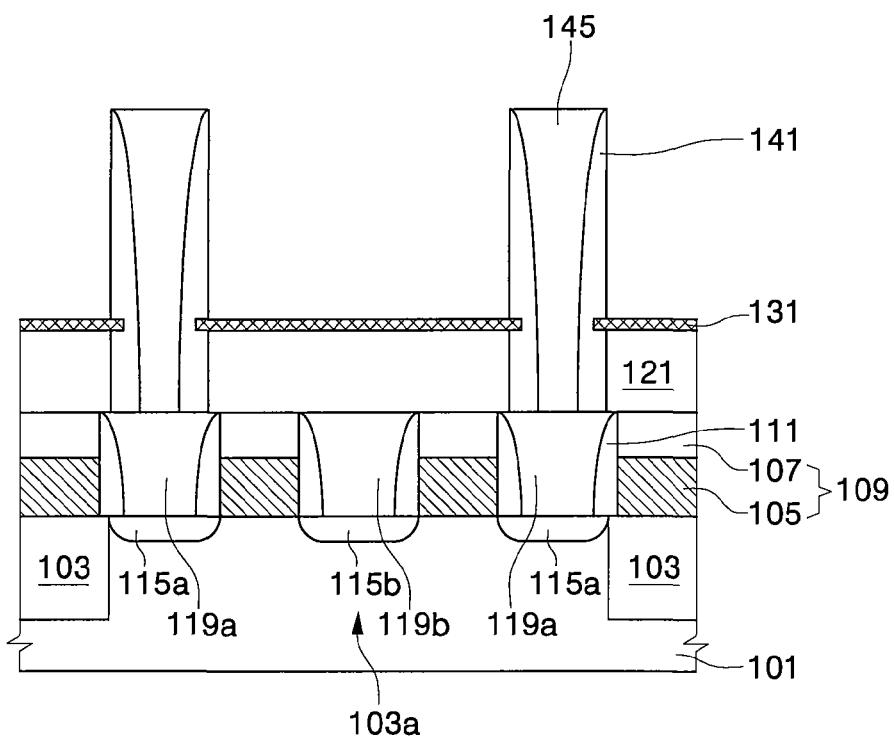
Figure 8A:
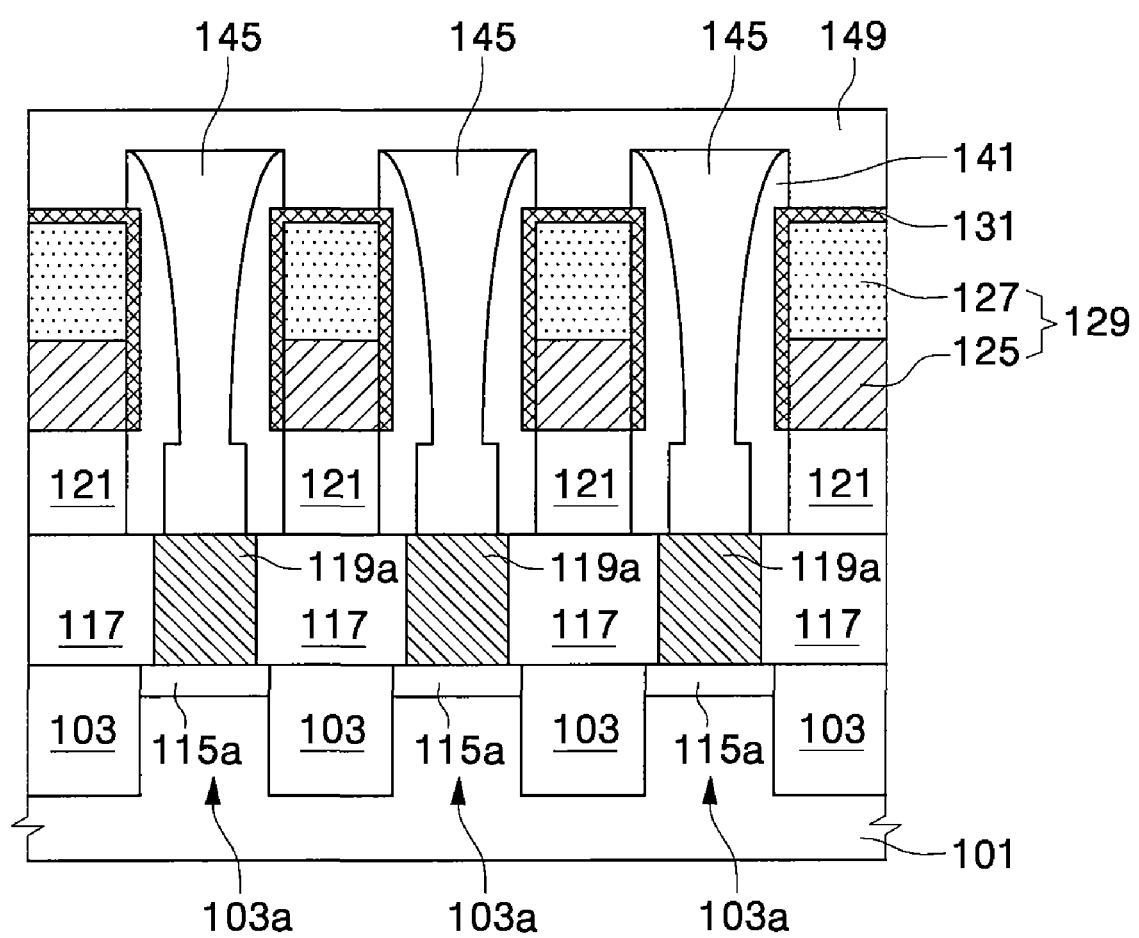
Figure 8B:
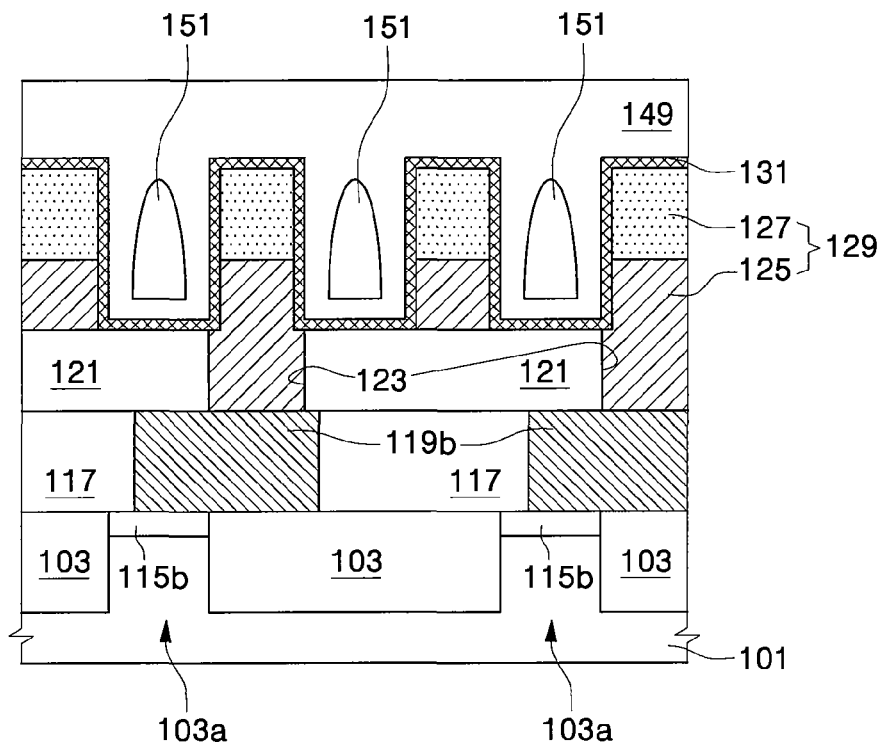
Figure 8C:
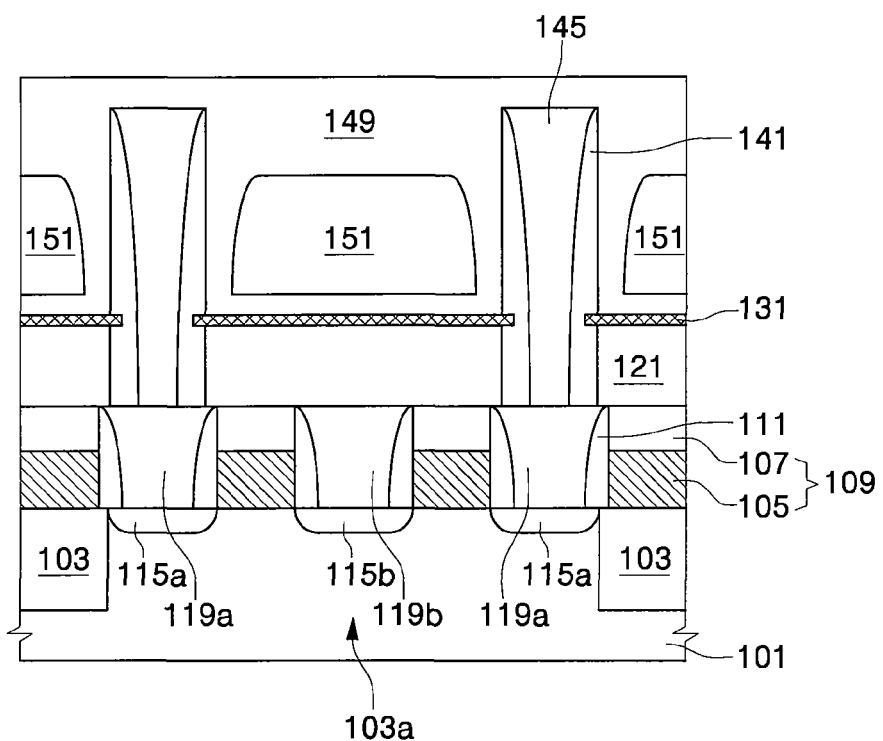
Figure 9A:
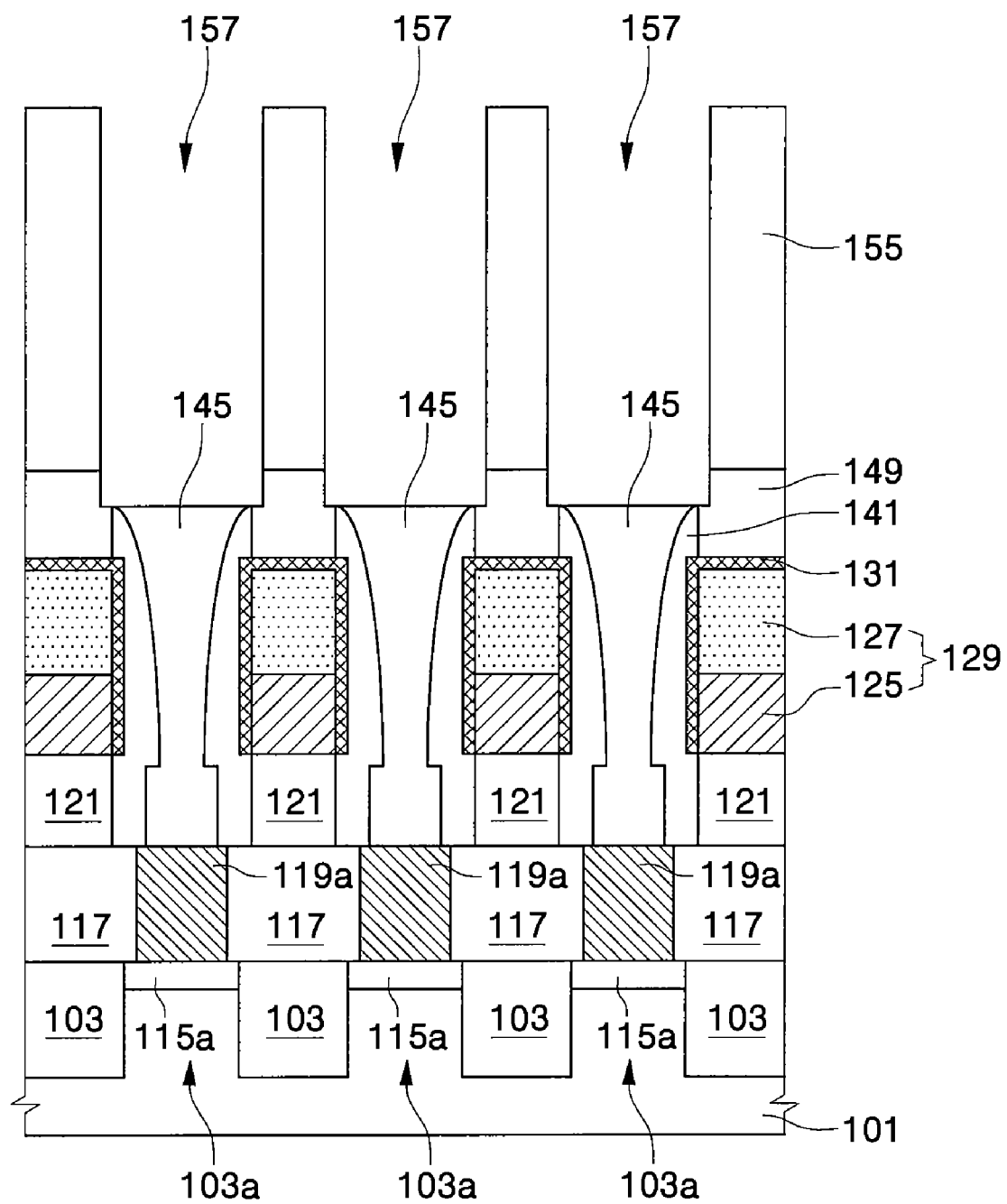
Figure 9B:
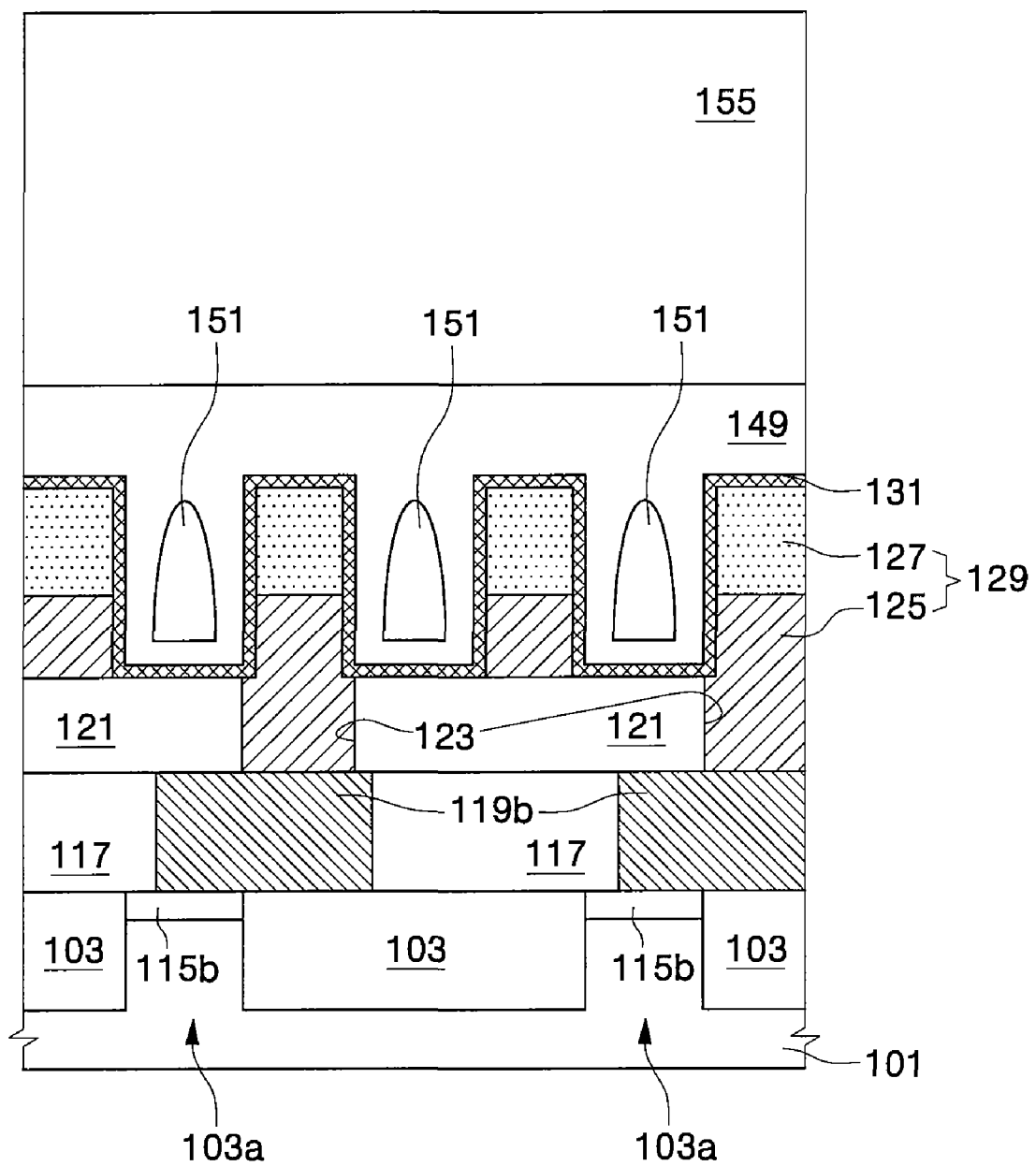
Figure 9C:
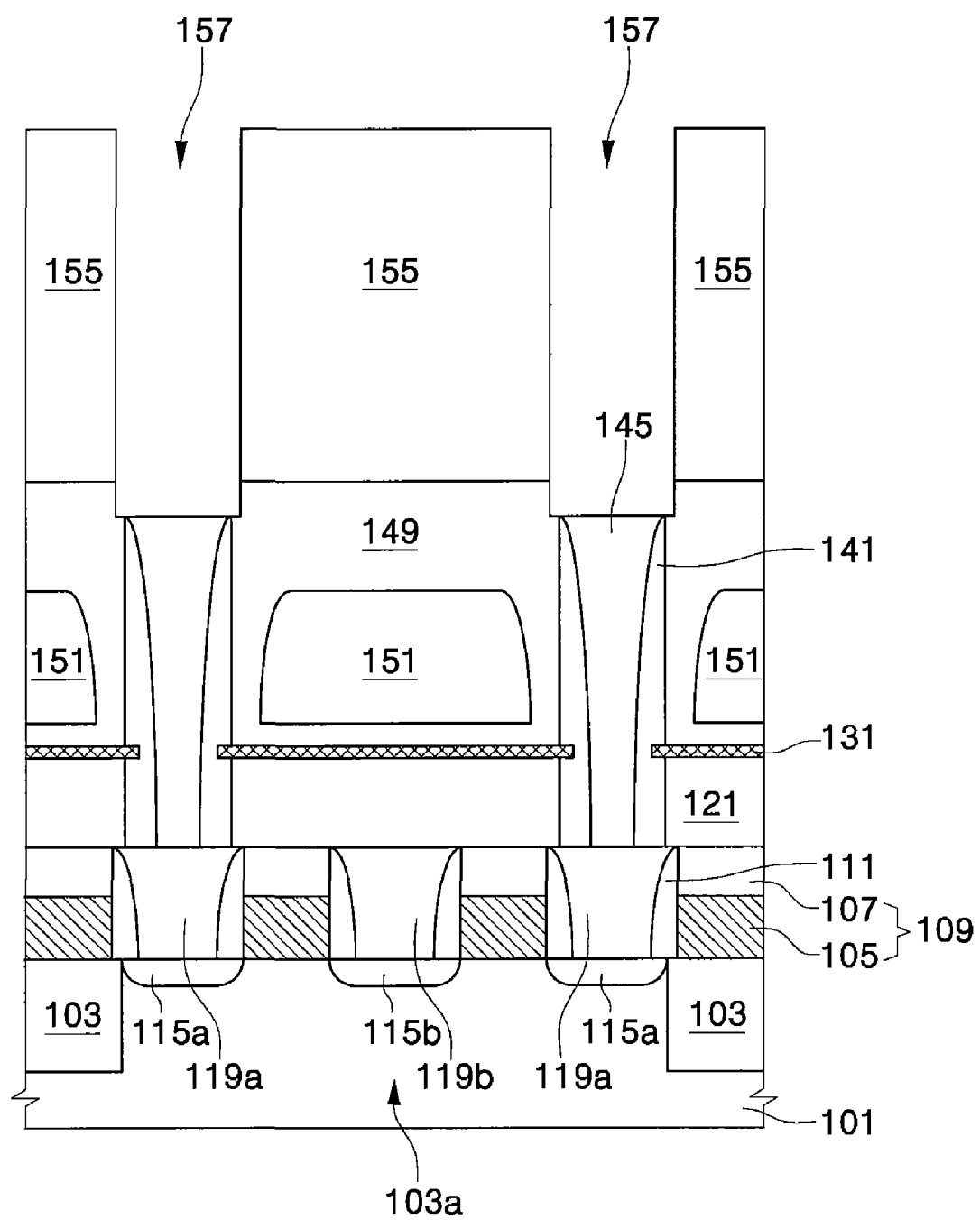

FIG. 3 is a plan view of a semiconductor device having voids according to an embodiment of the present invention. FIGS. 4A to 9C are cross-sectional views for explaining a method of fabricating a semiconductor device having voids according to an embodiment of the present invention. In FIGS. 4A to 9C, FIGS. 4A, 5A, 6A, 7A, 8A, and 9A are cross-sectional views taken along line I-I' of FIG. 3, and FIGS. 4B, 5B, 6B, 7B, 8B, and 9B are cross-sectional views taken along line II-II' of FIG. 3. In addition, FIGS. 4C, 5C, 6C, 7C, 8C, and 9C are cross-sectional views taken along line of FIG. 3.

Referring to FIGS. 3, 4A, 4B, and 4C, an isolation layer 103 is formed on a predetermined region of a semiconductor substrate 101 to define a plurality of active regions 103a which are two-dimensionally arrayed. The isolation layer 103 can be formed, for example, using a shallow trench isolation process. A plurality of word line patterns 109 are formed across the active regions 103a. In this case, each of the active regions 103a is divided into three regions by a pair of word line patterns 109. The active regions adjacent to both sides of the pair of word line patterns 109 are first impurity regions 115a, and the active regions between the first impurity regions 115a are second impurity region 115b. More specifically, gate insulating layers (not shown) are formed on the semiconductor substrate 101 having the active regions 103a, and subsequently, gate conductive layers and capping layers are formed. The capping layers and the gate conductive layers are sequentially patterned to form capping layer patterns 107 and word lines 105. In this case, the word lines 105 and the capping layer patterns 107 constitute word line patterns 109.

The word lines 105 may be constructed, for example, with a silicon layer or a metal layer. In a case where the word lines 105 comprise a silicon layer, in order to improve conductivity of the silicon layer, a metal silicide layer may be further formed on the silicon layer. In this case, the metal silicide layer may comprise a nickel silicide layer, cobalt silicide layer, or a tungsten silicide layer. The silicon layer may be, for example, a polysilicon layer or an amorphous silicon layer. The capping layer patterns 107 may comprise, for example, a silicon nitride layer.

On the other hand, a plurality of trenches (not shown) may be further formed across predetermined regions of the active regions 103a. In this case, the word lines 105 can be formed to fill the trenches and have a predetermined height from an upper surface of the semiconductor substrate.

Word line spacers 111 are formed to cover side walls of the word line patterns 109. The word line spacers 111 may comprise, for example, a silicon nitride layer or a stacked layer of a silicon oxide layer and a silicon nitride layer. By using the word line patterns 109 and the isolation layers 103 as ion implantation masks, impurity ions are implanted into the active regions 103a to form first impurity regions 115a and second impurity region 115b. As a result, the access transistors sharing a single one of the second impurity regions 115b are formed in the respective active regions 103a. An insulating layer 117 is formed on the entire surface of the semiconductor substrate 101. The insulating layer 117 can comprise, for example, a silicon oxide layer. In the insulating layer 117, buried contact landing pads 119a and direct contact landing pads 119b contacting the first impurity region 115a and the second impurity region 115b are formed by using a general self-align contact process. The landing pads 119a, 119b can be formed, for example, using a polysilicon layer. A lower interlayer insulating layer 121 is formed on the insulating layer 117. The lower interlayer insulating layer 121 comprises, for example, a silicon oxide layer.

Referring to FIGS. 3 and 5A to 5C, the lower interlayer insulating layer 121 is patterned to form direct contact holes 123 for exposing predetermined regions of the direct contact landing pads 119b. A plurality of bit line patterns 129 for filling the direct contact holes 123 and intersecting the word line patterns 109 are formed on the lower interlayer insulating layer 121 having the direct contact holes 123. More specifically, bit line conductive layers for filling the direct contact holes 123 and having a predetermined height from an upper surface of a lower interlayer insulating layer 121 are formed on the lower interlayer insulating layer 121 having the direct contact holes 123. Next, a hard mask layer is formed on the bit line conductive layer. Subsequently, the hard mask layer and the bit line conductive layer are sequentially patterned to form hard mask layer patterns 127 and bit lines 125. In this case, the bit lines 125 and the hard mask layer patterns 127 constitute the bit line patterns 129. The hard mask layer patterns 127 comprises, for example, a silicon nitride layer. The bit lines 125 comprise, for example, a polysilicon layer, a tungsten layer, or a stacked layer of a titanium nitride layer and a tungsten layer.

Next, a conformal passivation layer 131 is formed on the entire surface of the semiconductor substrate having the bit line patterns 129. For example, the passivation layer 131 can be formed to have a relatively thin thickness of about 20 to 100 angstroms. The passivation layer 131 comprises, for example, a silicon nitride layer.

Next, a first sacrificial insulating layer 133 for filling a space between the bit line patterns 129 is formed. The first sacrificial insulating layer 133 is constructed with an insulating layer having a high etching selection ratio with respect to the passivation layer 131. In other words, in a case where the passivation layer 131 comprises a silicon nitride layer, the first sacrificial insulating layer 133 comprises, for example, a silicon oxide layer. The voids generated within the first sacrificial insulating layer 133 may cause short failures between buried contact plugs during a buried contact plug formation process described later. Therefore, the first sacrificial insulating layer 133 comprises, in one embodiment, a high density plasma (HDP) oxide layer having good gap fill characteristics. Next, a planarization process is performed to expose the passivation layer on the bit line patterns 129. The planarization process can be performed, for example, by using an etch-back process or a chemical mechanical polishing process.

Referring to FIGS. 3 and 6A to 6C, a second sacrificial insulating layer 135 is formed on the first sacrificial insulating layer 133 and the exposed passivation layer 131. Similar to the first sacrificial insulating layer 133, the second sacrificial insulating layer 135 is also formed using an insulating layer having a high etching selection ratio relative to the passivation layer 131. In this case, the second sacrificial insulating layer 135 may have substantially the same etching selection ratio as the first sacrificial insulating layer 133. For example, in a case where the passivation layer 131 comprises a silicon nitride layer, the second sacrificial insulating layer 135 may comprise, for example, a silicon oxide layer. The first sacrificial insulating layer and the second sacrificial insulating layer constitute a final sacrificial insulating layer 137.

Alternatively, the first sacrificial insulating layer 133 and the second sacrificial insulating layer 135 may be simultaneously formed. In other words, the sacrificial insulating layer 137 for filling the space between the bit line patterns 129 and having a predetermined thickness from the passivation layer 131 on the bit line patterns 129 may be formed.

The sacrificial insulating layer 137, the passivation layer 131, and the lower interlayer insulating layer 121 are patterned to form buried contact holes 139 for exposing the buried contact landing pads 117a.

Next, by selectively isotropic-etching the sacrificial insulating layer 137 and the lower interlayer insulating layer 121, the dimensions of the buried contact holes 139 can be expanded. The isotropic etching process may be performed by using an etchant containing hydrofluoric acid. In this case, the passivation layer 131 can have an etch resistance to the isotropic etching. Therefore, the buried contact holes 139 can be formed to have a dimension that is slightly expanded due to the isotropic etching. In addition, a natural oxide layer and contamination materials formed on the exposed surfaces of the buried contact landing pads 119a during the isotropic etching process can be removed.

Referring to FIGS. 3 and 7A to 7C, a conformal spacer insulating layer is formed on the entire surface of the semiconductor substrate having the buried contact holes 139. The spacer insulating layer comprises, in one embodiment, a silicon nitride layer. Next, by performing an isotropic etching process on the spacer insulating layer to expose an upper surface of the sacrificial insulating layer 137 and an upper surface of the buried contact landing pads 117a, insulating spacers 141 for covering sidewalls of the buried contact holes 139 are formed.

Subsequently, buried contact plugs 145 for filling the buried contact holes 139 are formed. The buried contact plugs 145 can comprise, for example, a polysilicon layer or a metal layer.

More specifically, a buried contact plug conductive layer for filling the buried contact holes 139 and having a predetermined thickness from an upper surface of the sacrificial insulating layer 137 is formed. Next, a planarization process for exposing an upper surface of the sacrificial insulating layer 137 is performed on the buried contact plugs 145 for filling the buried contact holes 139.

Alternatively, after a buried contact plug conductive layer for filling the buried contact holes 139 and having a predetermined thickness from an upper surface of the sacrificial insulating layer 137 is formed, the buried contact plug conductive layer is patterned by using general photolithography and etching processes to fill the buried contact holes 139 and, simultaneously, to form the buried contact plugs 145 for covering a portion of an upper surface of the sacrificial insulating layer 137.

Subsequently, by using the passivation layer 131, the insulating spacers 141, and the buried contact plugs 145 as etch blocking layers, the sacrificial insulating layer 137 is selectively removed. For example, by using a wet etching process using an etchant containing hydrofluoric acid, the sacrificial insulating layer 137 may be selectively removed. In this case, the passivation layer 131, the insulating spacers 141, and the buried contact plugs 145 have an etch resistance to the etchant.

Referring to FIGS. 3 and 8A to 8C, an upper interlayer insulating layer 149 having poor step coverage is formed on the semiconductor substrate having the buried contact plugs 145. The upper interlayer insulating layer 149 comprises, for example, a silicon nitride (SiN) layer or a silicon oxide nitride (SiON) layer. In this case, as the semiconductor device becomes more highly integrated, intervals between the bit line patterns 129 decrease, and heights of the bit line patterns 129 increase. Therefore, the space between the bit line patterns 129 can be formed as a kind of trench having a high aspect ratio. As a result, the upper interlayer insulating layer 149 having poor step coverage cannot fill the space between the bit line patterns 129. Therefore, voids 151 made of air are formed between the bit line patterns 129. The voids 151 may have such a shape that the voids 151 are surrounded by the bit line patterns 129 and the buried contact plugs 145. In addition, lower regions of the voids 151 may be formed to be wider than upper regions thereof.

More specifically, the upper interlayer insulating layer 149 comprises, in one embodiment, a silicon nitride (SiN) layer having poor step coverage formed by using a chemical vapor deposition (CVD) method. For example, the silicon nitride layer may be formed by using a process gas containing $SiH_4$, $N_2$, and $NH_3$.

Alternatively, the upper interlayer insulating layer 149 can comprise a silicon oxide nitride (SiON) layer having poor step coverage by using a chemical vapor deposition (CVD) method. In this example, the silicon oxide nitride layer can be formed using a process gas containing $N_2$, $NH_3$, and $N_2O$. It can be understood by those of ordinarily skill in the art that the insulating layer having poor step coverage can be formed by properly modifying deposition variables such as a source gas flow rate, a chamber pressure, a processing temperature, and a processing time in accordance with process conditions by using a CVD apparatus. In particular, it can be understood by the ordinarily skilled in the art that, in the case of a plasma enhanced chemical vapor deposition (PECVD) apparatus, the insulating layer having poor step coverage can be readily formed.

Since the voids 151 are formed of air having a low dielectric constant, it is possible to reduce the parasitic capacitance generated between the bit lines 125.

Referring to FIGS. 3 and 9A to 9C, a mold insulating layer 155 for covering the upper interlayer insulating layer 149 is formed. The mold insulating layer 155 may be constructed with an insulating layer having an etching selection ratio with respect to the upper interlayer insulating layer 149. For example, in a case where the upper interlayer insulating layer 149 comprises a silicon nitride layer or a silicon oxide nitride layer, the mold insulating layer 155 may comprise a silicon oxide layer. Next, the mold insulating layer 155 and the upper interlayer insulating layer 149 are patterned to expose upper surfaces of the buried contact plugs 145, so that storage node electrode holes 157 are formed. Next, by performing a general cylindrical capacitor formation process, cylindrical capacitors can be formed. According to the present invention, since the upper interlayer insulating layer 149 is constructed with the insulating layer having an etching selection ratio with respect to the mold insulating layer 155, there is no need to form a separate etch blocking layer between the mold insulating layer 155 and the upper interlayer insulating layer 149. As a result, in comparison to the conventional cylindrical capacitor formation process, it is possible to reduce the number of process steps.

In addition, since the voids 151 made of air having a low dielectric constant are formed between the bit line patterns 129, it is possible to reduce the parasitic capacitance between the bit lines 125. As a result, it is possible to increase the resulting operating speeds of semiconductor devices such as DRAM devices.

A semiconductor device according to an embodiment of the present invention will be described again with reference to FIGS. 3 and 8A to 8C.

Referring to FIGS. 3 and 8A to 8C, an isolation layer 103 for defining a plurality of active regions 103a which are two-dimensionally arrayed is disposed in a semiconductor substrate 101. A plurality of word lines 105 are disposed across the active regions 103a. The word lines 105 can comprise, for example, a polysilicon layer or a stacked layer of a polysilicon layer and method silicide layer. Each of the active regions 103a is divided into three regions by a pair of word lines 105. The active regions adjacent to both sides of the pair of word lines 105 are first impurity regions 115a, and the active regions on the first impurity regions 115a are second impurity region 115b. Capping layer patterns 107 may be disposed on the word lines 105. The capping layer patterns 107 may comprise, for example, a silicon nitride layer. The word lines 105 and the capping layer patterns 107 constitute word line patterns 109. A gate insulating layer (not shown) can be interposed between the word lines 105 and the semiconductor substrate 101.

On the other hand, a plurality of trenches (not shown) may further be disposed across the active regions 103a. In this case, the word lines 105 may be disposed to fill the trenches.

Word line spacers 111 for covering side walls of the word line patterns 109 are disposed. The word line spacers 111 can comprise a silicon nitride layer. As a result, a pair of access transistors sharing a single second impurity region 115b may be formed in the respective active regions 103a.

An insulating layer 117 is formed on the semiconductor substrate having the access transistors. The insulating layer 117 may be a silicon oxide layer. Buried contact landing pads 119a and direct contact landing pads 119b passing through the insulating layer 117 are disposed. The buried contact landing pads 119a are electrically connected to the first impurity region 115a, and the direct contact landing pads 119b are electrically connected to the second impurity region 115b. The landing pads 119a and 119b may comprise a polysilicon layer.

A lower interlayer insulating layer 121 is disposed on the semiconductor substrate having the buried contact landing pads 119a and the direct contact landing pads 119b. The lower interlayer insulating layer 121 may comprise a silicon oxide layer. Direct contact holes 123 passing through the lower interlayer insulating layer 121 to expose the direct contact landing pads 119b are formed. On the lower interlayer insulating layer 121, a plurality of parallel bit lines 125 are disposed across the word line patterns 109 to fill the direct contact holes 123. Therefore, the bit lines 125 are electrically connected through the direct contact holes 123 to the direct contact pads 119b. The bit lines 125 comprise, for example, a polysilicon layer, a tungsten layer, or a stacked layer of a titanium nitride layer and a tungsten layer. Hard mask layer patterns 127 may be disposed on the bit lines 125. The bit lines 125 and the hard mask layer patterns 127 may constitute bit line patterns 129.

A conformal passivation layer 131 is disposed on the bit line patterns 129 and the lower interlayer insulating layer 121. For example, the passivation layer 131 may have a thickness of about 20 to 100 angstroms. The passivation layer 131 may be a silicon nitride layer.

An upper interlayer insulating layer 149 for covering a semiconductor substrate having the passivation layer 131 is formed. The upper interlayer insulating layer 149 may comprise a silicon nitride layer or a silicon oxide nitride layer having poor step coverage.

Buried contact plugs 145 are disposed in the upper interlayer insulating layer 149 between the bit line patterns 129 and extend to contact the respective buried contact landing pads 119a through the passivation layer 131 and the lower interlayer insulating layer 121. The buried contact plugs 145 may be a polysilicon layer. Voids 151 are formed in the upper interlayer insulating layers 149 between the bit line patterns 129 and between the buried contact plugs 145.

Insulating spacers 141 for covering side walls of the buried contact plugs 145 may further be disposed. The insulating spacers 141 may be formed from a silicon nitride layer.

As a result, the voids 151 are formed between the bit lines 125, so that the parasitic capacitance generated between the bit lines 125 can be reduced.

As described above, according to the embodiment of the present invention, it is possible to reduce parasitic capacitance between bit lines by forming voids having a low dielectric constant between the bit lines. Accordingly, it is possible to increase operating speed of a semiconductor device such as a DRAM.

While this invention has been particularly shown and described with references to preferred embodiments thereof, it will be understood by those skilled in the art that various changes in form and details may be made herein without departing from the spirit and scope of the invention as defined by the appended claims.

What is claimed is:

1. A semiconductor device comprising:
   a semiconductor substrate having buried contact landing pads and direct contact landing pads;
   a lower interlayer insulating layer disposed on the semiconductor substrate;
   a plurality of parallel bit line patterns disposed on the lower interlayer insulating layer to fill the direct contact holes;
   a passivation layer conformally covering the lower interlayer insulating layer and the bit line patterns;
   an upper interlayer insulating layer covering the semiconductor substrate having the passivation layer;
   buried contact plugs disposed in the upper interlayer insulating layer between the bit line patterns and extended to contact the respective buried contact landing pads through the passivation layer and the lower interlayer insulating layer;

storage node electrode holes formed in the upper interlayer insulating layer, the storage node electrode holes exposing upper surfaces of the buried contact plugs; and voids formed in the upper interlayer insulating layer between the bit line patterns and between the buried contact plugs.

2. The semiconductor device according to claim 1, wherein the bit line patterns comprise bit lines and hard mask layer patterns which are sequentially stacked.

3. The semiconductor device according to claim 2, wherein the bit lines comprise a polysilicon layer, a tungsten layer, or a stacked layer of a titanium nitride layer and a tungsten layer.

4. The semiconductor device according to claim 2, wherein the hard mask layer patterns comprise a silicon nitride layer.

5. The semiconductor device according to claim 1, wherein the passivation layer comprise a silicon nitride layer.

6. The semiconductor device according to claim 1, wherein the upper interlayer insulating layer comprise a silicon nitride layer or a silicon oxide nitride layer.

7. The semiconductor device according to claim 1, wherein the buried contact plugs comprise a polysilicon layer.

8. The semiconductor device according to claim 1, wherein the voids are encapsulated within the upper interlayer insulating layer.

9. The semiconductor device of according to claim 1, wherein the voids are formed between a top surface of the passivation layer and the upper surfaces of the buried contact plugs.

10. A semiconductor device comprising:
a semiconductor substrate having buried contact landing pads and direct contact landing pads;
a lower interlayer insulating layer disposed on the semiconductor substrate;
a plurality of parallel bit line patterns disposed on the lower interlayer insulating layer to fill the direct contact holes;
a passivation layer conformally covering the lower interlayer insulating layer and the bit line patterns;
an upper interlayer insulating layer covering the semiconductor substrate having the passivation layer;
buried contact plugs disposed in the upper interlayer insulating layer between the bit line patterns and extended to contact the respective buried contact landing pads through the passivation layer and the lower interlayer insulating layer;
insulating spacers for surrounding side walls of the buried contact plugs; and
voids formed in the upper interlayer insulating layer between the bit line patterns and between the buried contact plugs,
wherein the voids are encapsulated within the upper interlayer insulating layer.

11. The semiconductor device according to claim 10, wherein the insulating spacers comprise a silicon nitride layer.

12. The semiconductor device of according to claim 10, wherein the passivation layer is extended within the insulating spacers.

* * * * *